United States Patent
Oda et al.

(10) Patent No.: US 9,887,172 B2
(45) Date of Patent: Feb. 6, 2018

(54) BONDING WIRE FOR SEMICONDUCTOR DEVICE

(71) Applicants: NIPPON MICROMETAL CORPORATION, Iruma-shi, Saitama (JP); NIPPON STEEL & SUMIKIN MATERIALS CO., LTD., Tokyo (JP)

(72) Inventors: Daizo Oda, Saitama (JP); Motoki Eto, Saitama (JP); Kazuyuki Saito, Saitama (JP); Teruo Haibara, Saitama (JP); Ryo Oishi, Saitama (JP); Takashi Yamada, Saitama (JP); Tomohiro Uno, Tokyo (JP)

(73) Assignees: NIPPON MICROMETAL CORPORATION, Saitama (JP); NIPPON STEEL & SUMIKIN MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/305,584

(22) PCT Filed: Sep. 17, 2015

(86) PCT No.: PCT/JP2015/076487
§ 371 (c)(1),
(2) Date: Oct. 20, 2016

(87) PCT Pub. No.: WO2017/026077
PCT Pub. Date: Feb. 16, 2017

(65) Prior Publication Data
US 2017/0194280 A1 Jul. 6, 2017

(30) Foreign Application Priority Data
Aug. 12, 2015 (JP) .................................. 2015-159692

(51) Int. Cl.
*H01L 23/00* (2006.01)
*C22C 9/00* (2006.01)

(52) U.S. Cl.
CPC ................ *H01L 24/45* (2013.01); *C22C 9/00* (2013.01); *H01L 24/43* (2013.01);
(Continued)

(58) Field of Classification Search
CPC ..................... H01L 24/43; H01L 24/45; H01L 2924/00011; H01L 2924/10253; H01L 2924/1576; H01L 2924/181
(Continued)

(56) References Cited

U.S. PATENT DOCUMENTS

| 7,952,028 B2 | 5/2011 | Uno et al. |
| 2004/0014266 A1 | 1/2004 | Uno et al. |

(Continued)

FOREIGN PATENT DOCUMENTS

| CN | 102776408 A | 11/2012 |
| EP | 2413351 A1 | 2/2012 |

(Continued)

OTHER PUBLICATIONS

Decision to Grant issued in corresponding Taiwan Patent Application No. 104130999, dated Nov. 30, 2016.
(Continued)

*Primary Examiner* — Monica D Harrison
(74) *Attorney, Agent, or Firm* — McDermott Will & Emery LLP (57) ABSTRACT

A bonding wire for a semiconductor device includes a Cu alloy core material and a Pd coating layer on a surface of the Cu alloy core material, and contains Ga and Ge of 0.011 to 1.2% by mass in total, which is able to increase bonding longevity of the ball bonded part in the high-temperature, high-humidity environment, and thus to improve the bond- (Continued)

ing reliability. The thickness of the Pd coating layer is preferably 0.015 to 0.150 μm. When the bonding wire further contains one or more elements of Ni, Ir, and Pt in an amount, for each element, of 0.011 to 1.2% by mass, it is able to improve the reliability of the ball bonded part in a high-temperature environment at 175° C. or more. When an alloy skin layer containing Au and Pd is further formed on a surface of the Pd coating layer, wedge bondability improves.

9 Claims, 1 Drawing Sheet

(52) U.S. Cl.
CPC ............. *H01L 2224/05624* (2013.01); *H01L 2224/4312* (2013.01); *H01L 2224/43125* (2013.01); *H01L 2224/43825* (2013.01); *H01L 2224/43826* (2013.01); *H01L 2224/43827* (2013.01); *H01L 2224/43848* (2013.01); *H01L 2224/43986* (2013.01); *H01L 2224/45015* (2013.01); *H01L 2224/45105* (2013.01); *H01L 2224/45147* (2013.01); *H01L 2224/45565* (2013.01); *H01L 2224/45572* (2013.01); *H01L 2224/45644* (2013.01); *H01L 2224/45664* (2013.01); *H01L 2224/48465* (2013.01); *H01L 2224/48507* (2013.01); *H01L 2224/48824* (2013.01); *H01L 2224/85045* (2013.01); *H01L 2224/85065* (2013.01); *H01L 2224/85075* (2013.01); *H01L 2224/85439* (2013.01); *H01L 2924/00011* (2013.01); *H01L 2924/10253* (2013.01); *H01L 2924/1576* (2013.01); *H01L 2924/181* (2013.01)

(58) Field of Classification Search
USPC ....................................................... 257/762
See application file for complete search history.

(56) References Cited

U.S. PATENT DOCUMENTS

| | | |
|---|---|---|
| 2010/0282495 A1 | 11/2010 | Uno et al. |
| 2012/0292774 A1 | 11/2012 | Itoh |
| 2012/0299182 A1 | 11/2012 | Uno et al. |
| 2013/0180757 A1 | 7/2013 | Uno et al. |
| 2015/0054146 A1 | 2/2015 | Itoh |
| 2017/0117244 A1* | 4/2017 | Yamada .................. H01L 24/45 |

FOREIGN PATENT DOCUMENTS

| | | |
|---|---|---|
| EP | 2461358 A1 | 6/2012 |
| JP | S61-48543 A | 3/1986 |
| JP | S61-255045 A | 11/1986 |
| JP | S62-130248 A | 6/1987 |
| JP | S63-235440 A | 9/1988 |
| JP | 2005-167020 A | 6/2005 |
| JP | 2006-100777 A | 4/2006 |
| JP | 2008-085319 A | 4/2008 |
| JP | 4-637256 B1 | 2/2011 |
| JP | 2011-077254 A | 4/2011 |
| JP | 2011-159894 A | 8/2011 |
| JP | 2012-036490 A | 2/2012 |
| JP | 2014-070252 A | 4/2014 |
| JP | 2014-165272 A | 9/2014 |
| KR | 10-2004-0073667 A | 8/2004 |
| KR | 10-2012-0046019 A | 5/2012 |
| KR | 10-2015-0030554 A | 3/2015 |
| TW | 201140718 A | 11/2011 |
| TW | 201140782 A | 11/2011 |
| WO | 2009/093554 A1 | 7/2009 |
| WO | 2011/093038 A1 | 8/2011 |
| WO | 2015/115241 A1 | 8/2015 |

OTHER PUBLICATIONS

Partial Supplementary European Search Report issued in corresponding EP Application No. 15889429.5, dated Jan. 10, 2017.
Notice of Rejection issued in corresponding Japanese Patent Application No. 2015-560454, dated Mar. 11, 2016.
Decision of Patent Grant issued in corresponding Japanese Patent Application No. 2015-560454, dated Aug. 9, 2016.
Search Report issued in corresponding International Application No. PCT/JP2015/076487, dated Dec. 8, 2015.
Office Action issued in corresponding Korean Patent Application No. 10-2016-7028190, dated Feb. 17, 2017.
Korean Decision to Grant issued in Application No. 10-2016-7028190 dated Apr. 25, 2017, with English translation.
Jae-Hyung Cho et al., "Investigation of Recrystallization and Grain Growth of Copper and Gold Bonding Wires", Metallurgical and Materials Transactions A, Springer-Verlag, New York, vol. 37, No. 10, pp. 3085-3097 (Oct. 2006).
Extended European Search Report issued in corresponding EP Patent Application No. 15889429.5, dated Apr. 24, 2017.

* cited by examiner

BONDING WIRE FOR SEMICONDUCTOR DEVICE

CROSS REFERENCE

This application is the U.S. National Phase under 35 U.S.C. §371 of International Application No. PCT/JP2015/076487, filed on Sep. 17, 2015, which claims the benefit of Japanese Application No. 2015-159692, filed on Aug. 12, 2015, the entire contents of each are hereby incorporated by reference.

TECHNICAL FIELD

The present invention relates to a bonding wire for a semiconductor device used to connect electrodes on a semiconductor device and wiring of a circuit wiring board such as outer leads.

BACKGROUND ART

Currently, as a bonding wire for a semiconductor device connecting between electrodes on a semiconductor device and outer leads (hereinafter, may be referred to as a "bonding wire"), thin wires with a wire diameter of about 15 to 50 μm are mainly being used. A method for bonding the bonding wire is generally a thermal compressive bonding technique with the aid of ultrasound, which uses a general-purpose bonder, a capillary tool used for bonding by passing the bonding wire therethrough, and the like. A bonding process of the bonding wire includes heating and melting a wire tip with arc heat input, forming a ball (FAB: free air ball) through surface tension, performs crimp bonding (hereinafter, may be referred to as "ball bonding") of this ball onto the electrode of the semiconductor device heated within the range of 150 to 300° C., forming a loop, and finally performs crimp bonding (hereinafter, may be referred to as "wedge bonding") of a wire onto an electrode of the outer lead. As bonding counterparts of the bonding wire, an electrode structure in which an alloy mainly containing Al is formed as a film on a Si substrate is used for the electrode on the semiconductor device, whereas an electrode structure plated with Ag or Pd is used for the electrode of the outer lead.

Au, which has been mainly used as a material of the bonding wire, has been being replaced with Cu mainly for LSI use. On the background of recent proliferation of electric vehicles and hybrid vehicles, needs for replacing Au with Cu are increasing also in on-vehicle device use.

A Cu bonding wire using high-purity Cu (purity: 99.99% by mass or more) is developed (Patent Literature 1, for example). Cu has the drawback of being more susceptible to oxidation than Au and has problems in that bonding reliability, ball formability, and wedge bondability are inferior. As a method for preventing surface oxidation of the Cu bonding wire, a structure that coats a surface of a Cu core material with a metal such as Au, Ag, Pt, Pd, Ni, Co, Cr, or Ti is developed (Patent Literature 2). A structure that coats the surface of the Cu core material with Pd and coats a surface thereof with Au, Ag, Cu, or an alloy thereof is developed (Patent Literature 3).

RELATED ART REFERENCE

Patent Literature

Patent Literature 1: JP-A-S61-48543
Patent Literature 2: JP-A-2005-167020
Patent Literature 3: JP-A-2012-36490

SUMMARY OF INVENTION

Problem to be Solved by the Invention

On-vehicle devices require bonding reliability in a more rigorous high-temperature and high-humidity environment than general electronic devices. In particular, the bonding longevity of a ball bonded part in which the ball of the wire is bonded to the electrode is the biggest issue. Some methods are developed that evaluate the bonding reliability in the high-temperature and high-humidity environment; a representative method of evaluation is a highly accelerated temperature and humidity stress test (HAST). When the bonding reliability of the ball bonded part is evaluated by HAST, a ball bonded part to be evaluated is exposed to a high-temperature and high-humidity environment with a temperature of 130° C. and a relative humidity of 85%, and temporal changes in a resistance value of the bonded part are measured, or temporal changes in shear strength of the ball bonded part are measured, thereby evaluating the bonding longevity of the ball bonded part. A bonding longevity of 100 hours or more in HAST with such conditions has recently been required.

It has been revealed that when bonding with a pure Al electrode is performed using a conventional Cu bonding wire with Pd coating layer, 1st bonding is ball bonding, 2nd bonding is wedge bonding, sealing is performed with a mold resin, and an evaluation is performed on the HAST conditions, the bonding longevity of the ball bonded part may be less than 100 hours, and the bonding reliability required in on-vehicle devices is not sufficient.

An object of the present invention is to provide a Cu bonding wire having a Pd coating layer on a surface thereof, the bonding wire improving bonding reliability of a ball bonded part in a high-temperature and high-humidity environment and being suitable for on-vehicle devices.

Means for Solving Problem

That is, the present invention employs the following structures.
(1) A bonding wire for a semiconductor device, comprising: a Cu alloy core material; and a Pd coating layer formed on a surface of the Cu alloy core material, wherein the bonding wire contains one or more elements selected from Ga and Ge, and a concentration of the elements in total relative to the entire wire is 0.011 to 1.5% by mass.
(2) The bonding wire for a semiconductor device according to (1), wherein a thickness of the Pd coating layer is 0.015 to 0.150 μm.
(3) The bonding wire for a semiconductor device according to (1) or (2), further comprising an alloy skin layer containing Au and Pd on the Pd coating layer.

(4) The bonding wire for a semiconductor device according to (3), wherein a thickness of the alloy skin layer containing Au and Pd is 0.0005 to 0.050 μm.
(5) The bonding wire for a semiconductor device according to any one of (1) to (4), wherein the bonding wire further contains one or more elements selected from Ni, Ir, and Pt, and a concentration of each of the elements relative to the entire wire is 0.011 to 1.2% by mass.
(6) The bonding wire for a semiconductor device according to any one of (1) to (5), wherein the Cu alloy core material contains Pd, and a concentration of Pd contained in the Cu alloy core material is 0.05 to 1.2% by mass.
(7) The bonding wire for a semiconductor device according to any one of (1) to (6), wherein the bonding wire further contains at least one element selected from B, P, and Mg, and a concentration of each of the elements relative to the entire wire is 1 to 100 ppm by mass.
(8) The bonding wire for a semiconductor device according to any one of (1) to (7), in a measurement result when measuring crystal orientations on a surface of the bonding wire, a crystal orientation <111> angled at 15 degrees or less to a longitudinal direction has a proportion of 30 to 100% in terms of areal percentage among crystal orientations in the longitudinal direction of the bonding wire.
(9) The bonding wire for a semiconductor device according to any one of (1) to (8), wherein Cu is present in an outermost surface of the bonding wire.

Effect of the Invention

The present invention is a bonding wire for a semiconductor device which includes a Cu alloy core material and a Pd coating layer formed on a surface of the Cu alloy core material. The bonding wire contains one or more elements selected from Ga and Ge in a certain amount and can thereby improve the bonding longevity of a ball bonded part in a high-temperature, high-humidity environment and can improve bonding reliability.

EMBODIMENT FOR CARRYING OUT THE INVENTION

Figure 1:
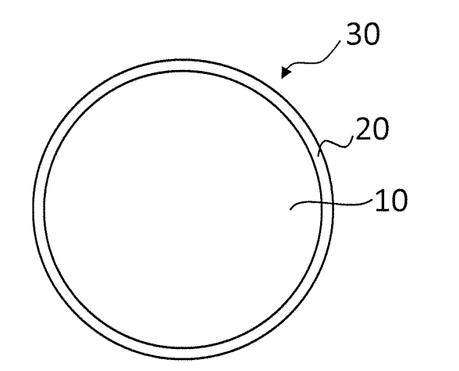
FIG. 1 is a cross sectional view of a bonding wire according to one embodiment of the present disclosure.

As shown in FIG. 1, a bonding wire 30 of the present invention includes a Cu alloy core material 10 and a Pd coating layer 20 formed on a surface of the Cu alloy core material 10, and is characterized that the bonding wire contains one or more elements selected from Ga and Ge, and a concentration of Ga and Ge in total relative to the entire wire is 0.011 to 1.5% by mass. The bonding wire of the present invention can improve the bonding reliability of a ball bonded part in a high-temperature, high-humidity environment required in on-vehicle devices.

As described in more detail below, when a ball is formed by arc discharge using the boding wire of the present invention, an alloy layer having a higher Pd concentration than the inside of the ball is formed on a surface of the ball in a process in which the bonding wire melts and solidifies. When bonding with an Al electrode is performed using this ball, and a high-temperature and high-humidity test is performed, Pd is concentrated in a bonding interface. A concentrated layer formed by the concentrated Pd can reduce the diffusion of Cu and Al in the bonding interface during the high-temperature and high-humidity test and reduce a growth rate of a corrodible compound. With this phenomenon, the bonding wire of the present invention can improve the bonding reliability.

The alloy layer in which the concentration of Pd is high formed on the surface of the ball is excellent in oxidation resistance and can thereby reduce failures such as deviation of a ball forming position relative to the center of the bonding wire when the ball is formed.

In view of improving the bonding longevity of the ball bonded part in a high-temperature, high-humidity environment with a temperature of 130° C. and a relative humidity of 85% and improving the bonding reliability, the concentration of Ga and Ge in total relative to the entire wire is 0.011% by mass, preferably 0.025% by mass or more, more preferably 0.031% by mass or more, further preferably 0.050% by mass or more, 0.070% by mass or more, 0.090% by mass or more, 0.100% by mass or more, 0.150% by mass or more, or 0.200% by mass or more. When the concentration of Ga and Ge in total relative to the entire wire is 0.100% by mass or more, a requirement for more rigorous bonding reliability can be addressed.

When the bonding wire of the present invention contains Ge alone, the concentration of Ge relative to the entire wire is preferably 0.025% by mass or more.

A mold resin (an epoxy resin) as a package of a semiconductor device contains chlorine (Cl) in its molecular skeleton. In the high-temperature and high-humidity environment with a temperature of 130° C. and a relative humidity of 85% as a HAST evaluation condition, Cl in the molecular skeleton hydrolyzes and dissolves as a chloride ion (Cl$^-$). When the Cu bonding wire without the Pd coating layer is bonded to the Al electrode, when a Cu/Al bonding interface is placed in high temperature, Cu and Al mutually diffuse, and $Cu_9Al_4$ as an intermetallic compound is finally formed. $Cu_9Al_4$ is susceptible to corrosion by halogen such as Cl and undergoes corrosion by Cl dissolved from the mold resin, leading to degradation in the bonding reliability. When the Cu wire has the Pd coating layer, the bonding interface between the Pd-coated Cu wire and the Al electrode has a structure of Cu/Pd-concentrated layer/Al, whereby the bonding reliability in a high-temperature and high-humidity environment required in on-vehicle devices is insufficient, although the formation of the $Cu_9Al_4$ intermetallic compound is reduced compared with the Cu wire without the Pd coating layer.

In contrast, it is considered that when the Pd-coated Cu bonding wire contains one or more elements selected from Ga and Ge in a certain amount as in the present invention, the formation of the $Cu_9Al_4$ intermetallic compound in the bonded part tends to be further reduced. When the FAB of the ball bonded part is formed, Ga and Ge in the wire diffuse also to the Pd coating layer. It is considered that Ga and Ge present in the Pd-concentrated layer of the Cu/Al interface in the ball bonded part has the effect of further enhancing a mutual diffusion reduction effect of Cu and Al by the Pd-concentrated layer, resulting in the reduction of the formation of $Cu_9Al_4$, which is likely to corrode in the high-temperature, high-humidity environment. In addition, Ga and Ge contained in the wire may have the effect of directly inhibiting the formation of $Cu_9Al_4$.

Furthermore, when the ball was formed using the Pd-coated Cu bonding wire containing at least one element selected from Ga and Ge in a certain amount, and a FAB was observed by a scanning electron microscope (SEM), many precipitates with a diameter of about a few tens of nanometers were seen on a surface of the FAB. When the precipitates were analyzed by energy dispersive X-ray spectroscopy (EDS), it was revealed that Ga and Ge were concentrated. From the foregoing situation, it is considered that these precipitates observed on the FAB are present in the bonding interface between the ball and the electrode, whereby the bonding reliability of the ball bonded part in the high-temperature, high-humidity environment with a temperature of 130° C. and a relative humidity of 85% significantly improves, although a detailed mechanism is unclear.

Although Ga and Ge are preferably present in the Cu alloy core material, a sufficient effect can be obtained even by being contained in the Pd coating layer or an alloy skin layer containing Au and Pd described below. The method that adds Ga and Ge to the Cu alloy core material is easy in terms of accurate concentration control, by which wire productivity and quality stability improve. Part of Ga and Ge is contained also in the Pd coating layer or the alloy skin layer caused by diffusion through heat treatment or the like, whereby adhesiveness of the interfaces among the layers improves, which can further improve the wire productivity.

In view of obtaining favorable FAB shape and in view of reducing the hardening of the bonding wire to obtain favorable wedge bondability, the concentration of Ga and Ge in total relative to the entire wire is 1.5% by mass or less, preferably 1.4% by mass or less, and more preferably 1.3% by mass or less or 1.2% by mass or less.

In the bonding wire of the present invention, Cu may be present in an outermost surface of the Pd coating layer. If the concentration of Cu is 30 at % or more, the sulfur resistance of the wire surface degrades, and the service life of the bonding wire degrades, which is not necessarily suitable for practical use. Consequently, when Cu is present in the outermost surface of the Pd coating layer, the concentration of Cu is preferably less than 30 at %. The outermost surface refers to a region in which the surface of the bonding wire has been measured by an Auger electron spectroscopic apparatus without performing sputtering or the like.

In the bonding wire of the present invention, the thickness of the Pd coating layer is preferably 0.015 μm or more, more preferably 0.02 μm or more, and further more preferably 0.025 μm or more, 0.03 μm or more, 0.035 μm or more, 0.04 μm or more, 0.045 μm or more, or 0.05 μm or more in view of further improving the bonding reliability of the ball bonded part in the high-temperature, high-humidity environment required in on-vehicle devices and in view of reducing the eccentricity of the FAB to obtain more favorable FAB shape. The thickness of the Pd coating layer is preferably 0.150 μm or less and more preferably 0.140 μm or less, 0.130 μm or less, 0.120 μm or less, 0.110 μm or less, or 0.100 μm or less in view of reducing shrinkage cavities in the FAB to obtain favorable FAB shape.

The following describes the definition of the Cu alloy core material and the Pd coating layer of the bonding wire. A boundary between the Cu alloy core material and the Pd coating layer was determined based on a Pd concentration. With a position at which the Pd concentration was 50 at % as the boundary, a region in which the Pd concentration was 50 at % or more was determined to be the Pd coating layer, and a region in which the Pd concentration was less than 50 at % was determined to be the Cu alloy core material. These are because if the Pd concentration is 50 at % or more in the Pd coating layer, a characteristics improvement effect can be obtained from the structure of the Pd coating layer. The Pd coating layer may contain a region of a Pd single layer and a region in which Pd and Cu have concentration gradients in a wire depth direction. The reason why the region having the concentration gradients is formed in the Pd coating layer is that atoms of Pd and Cu may diffuse through heat treatment or the like in a manufacturing process. Furthermore, the Pd coating layer may contain inevitable impurities.

The bonding wire of the present invention may further form the alloy skin layer containing Au and Pd on the Pd coating layer. With this configuration, the bonding wire of the present invention can further improve the wedge bondability.

The following describes the definition of the alloy skin layer containing Au and Pd of the bonding wire. A boundary between the alloy skin layer containing Au and Pd and the Pd coating layer was determined based on an Au concentration. With a position at which the Au concentration was 10 at % as the boundary, a region in which the Au concentration was 10 at % or more was determined to be the alloy skin layer containing Au and Pd, and a region in which the Au concentration was less than 10 at % was determined to be the Pd coating layer. Even in the region in which the Pd concentration was 50 at % or more, if Au was present in 10 at % or more, the region was determined to be the alloy skin layer containing Au and Pd. These are because if the Au concentration is in the above concentration range, a characteristics improvement effect can be expected from the structure of an Au skin layer. The alloy skin layer containing Au and Pd is an Au—Pd alloy and includes both a case including a region in which Au and Pd have concentration gradients in the wire depth direction and a case not including the region having the concentration gradients. The alloy skin layer containing Au and Pd preferably includes the region having the concentration gradients. The reason why the region having the concentration gradients is formed in the alloy skin layer containing Au and Pd is that atoms of Au and Pd diffuse through the heat treatment or the like in the manufacturing process. Furthermore, the alloy skin layer containing Au and Pd may contain inevitable impurities and Cu.

In the bonding wire of the present invention, the alloy skin layer containing Au and Pd reacts with the Pd coating layer to improve adhesive strength among the alloy skin layer containing Au and Pd, the Pd coating layer, and the Cu alloy core material and to prevent the Pd coating layer and the alloy skin layer containing Au and Pd from peeling at the time of the wedge bonding. With this phenomenon, the bonding wire of the present invention can further improve the wedge bondability. If the thickness of the alloy skin layer containing Au and Pd is less than 0.0005 μm, the above effect is not obtained, and if the thickness is larger than 0.050 μm, the FAB shape may be eccentric. In view of obtaining favorable wedge bondability, the thickness of the alloy skin layer containing Au and Pd is preferably 0.0005 μm or more and more preferably 0.001 μm or more, 0.002 μm or more, or 0.003 μm or more. In view of reducing eccentricity to obtain favorable FAB shape, the thickness of the alloy skin layer containing Au and Pd is preferably 0.050 μm or less and more preferably 0.045 μm or less, 0.040 μm or less, 0.035 μm or less, or 0.030 μm or less. The alloy skin layer containing Au and Pd can be formed by a method similar to that of the Pd coating layer.

In the boding wire of the present invention, Cu may be present in an outermost surface of the alloy skin layer containing Au and Pd. If the concentration of Cu is 35 at % or more, the sulfur resistance of the wire surface degrades, and the service life of the bonding wire degrades, which is not necessarily suitable for practical use. Consequently, when Cu is present in the outermost surface of the Au skin layer, the concentration of Cu is preferably less than 35 at %. The outermost surface refers to a region in which the surface of the bonding wire has been measured by an Auger electron spectroscopic apparatus without performing sputtering or the like.

The mold resin (the epoxy resin) as the package of the semiconductor device contains a silane coupling agent. The silane coupling agent has a function of improving adhesiveness between organic matter (resin) and inorganic matter (silicon or metal) and can thereby improve adhesiveness with a silicon substrate or metal. Furthermore, when higher adhesiveness is required such as on-vehicle semiconductors that require reliability at higher temperatures, a "sulfur-containing silane coupling agent" is added. Sulfur contained in the mold resin is not freed at about 130° C. as the temperature condition of HAST, but is freed when being used on the condition of 175° C. to 200° C. or more. When sulfur freed at a high temperature of 175° C. or more is in contact with Cu, Cu violently corrodes to produce a sulfide ($Cu_2S$) or an oxide (CuO). When the corrosion of Cu is produced in the semiconductor device using the Cu bonding wire, the bonding reliability degrades especially of the ball bonded part.

As means for evaluating reliability of the ball bonded part in a high-temperature environment at 175° C. or more, a high temperature storage test (HTS) is used. For a sample to be evaluated exposed to a high-temperature environment, temporal changes in a resistance value of the bonded part are measured, or temporal changes in shear strength of the ball bonded part are measured, thereby evaluating the bonding longevity of the ball bonded part. Recently, in on-vehicle semiconductor devices, improvement in the reliability of the ball bonded part in HTS of 175° C. to 200° C. has been required.

The bonding wire of the present invention preferably contains one or more elements selected from Ni, Ir, and Pt in which the concentration of each of the elements relative to the entire wire is 0.011 to 1.2% by mass. The bonding wire containing these elements improves performance in HTS at 175° C. or more in the bonding reliability of the ball bonded part in a high-temperature environment. If the concentration of each of the elements in the bonding wire is less than 0.011% by mass, the above effect is not obtained, and if the concentration is higher than 1.2% by mass, the FAB shape degrades, the bonding wire hardens, and the deformation of the wire bonded part is insufficient, thereby causing a problem of degradation in the wedge bondability. When the Cu alloy core material of the bonding wire contains Pd, if the concentration of Pd contained in the Cu alloy core material is 0.05 to 1.2% by mass, an effect similar to that of Ni, Ir, and Pt can be obtained. Furthermore, Ni, Ir, Pt, and Pd are contained in the above content range, whereby loop formability can be improved, that is, leaning, which causes a problem in high-density mounting, can be reduced. This is because the bonding wire contains these elements, whereby yield strength of the bonding wire improves, and deformation of the bonding wire can be reduced.

Ni, Ir, Pt, and Pd are contained in the above content range, whereby the bonding longevity of the ball bonded part in the high-temperature, high-humidity environment with a temperature of 130° C. and a relative humidity of 85% can further be improved. It is considered that when the Pd-coated Cu bonding wire contains Ni, Ir, Pt, and Pd as in the present invention, the formation of the $Cu_9Al_4$ intermetallic compound in the bonded part tends to be further reduced. When these elements are added, interfacial tension between Cu as the core material and Pd as the coating layer reduces, and the Pd concentration on a ball bonded interface appears more effectively. Consequently, it is estimated that the mutual diffusion reduction effect of Cu and Al by the Pd-concentrated layer is further enhanced, and consequently, a formation amount of $Cu_9Al_4$, which is likely to corrode through the action of Cl, is reduced, and the bonding reliability of the ball bonded part in the high-temperature, high-humidity environment can further improve.

When the bonding wire of the present invention contains one or more elements selected from Ni, Ir, and Pt, the concentration of each of the elements relative to the entire wire is more preferably 0.02% by mass or more, 0.05% by mass or more, 0.1% by mass or more, 0.2% by mass or more, 0.3% by mass or more, or 0.5% by mass or more. In the boding wire of the present invention, when the Cu alloy core material contains Pd, the concentration of Pd contained in the Cu alloy core material is more preferably 0.1% by mass or more, 0.2% by mass or more, 0.3% by mass or more, or 0.5% by mass or more. Examples of a method for determining the concentration of Pd contained in the Cu alloy core material from a bonding wire product include a method that exposes a section of a bonding wire and performs concentration analysis of the region of the Cu alloy core material and a method that performs concentration analysis of the region of the Cu alloy core material while trimming the bonding wire from its surface in a depth direction by sputtering or the like. For example, when the Cu alloy core material contains a region having a Pd concentration gradient, line analysis may be performed on a section of the bonding wire, and concentration analysis of a region that has no Pd concentration gradient (for example, a region in which the degree of a change in the concentration of Pd in the depth direction is less than 10 mol % per 0.1 μm) may be performed. Also for elements other than Pd, when the concentrations of the elements contained in the Cu alloy core material are determined from a bonding wire product, a method similar to the above may be used. A method of concentration analysis will be described below.

The bonding wire of the present invention further contains at least one element selected from B, P, and Mg, the concentration of each of the elements relative to the entire wire being 1 to 100 ppm by mass and can thereby improve a crushed shape of the ball bonded part required in high-density mounting, that is, improve the circularity of the shape of the ball bonded part. This is because the addition of the elements can make the crystal grain size of the ball fine and can reduce the deformation of the ball. If the concentration of the elements relative to the entire wire is less than 1 ppm by mass, the effect is not obtained, and if the concentration exceeds 100 ppm by mass, the ball hardens, and chip damage at the time of ball bonding becomes a problem, which may be unsuitable for practical use. The concentration of each of the elements relative to the entire wire is more preferably 3 ppm by mass or more or 5 ppm by mass or more. The concentration of each of the elements relative to the entire wire is more preferably 95 ppm by mass or less, 90 ppm by mass or less, 85 ppm by mass or less, or 80 ppm by mass or less.

For the concentration analysis of the Pd coating layer and the alloy skin layer containing Au and Pd and the concentration analysis of Pd in the Cu alloy core material, a method that performs analysis while trimming the bonding wire from its surface in the depth direction by sputtering or the like or a method that exposes a wire section and performs line analysis, point analysis, or the like on the trimmed bonding wire are effective. Examples of an analyzer used for the concentration analysis include an Auger electron spectroscopic apparatus installed in a scanning electron microscope or a transmission electron microscope, an energy dispersive X-ray analyzer, and an electron probe micro analyzer. Examples of a method for exposing the wire section include mechanical polishing and ion etching. Concerning microanalysis of Ga, Ge, Ni, Ir, Pt, B, P, Mg, and the like in the boding wire, they can be detected as the concentrations of the elements contained in the entire bonding wire by analyzing a solution obtained by dissolving the bonding wire with a strong acid using an ICP emission spectrometer or an ICP mass spectrometer.

If a crystal orientation <111> angled at 15 degrees or less to a longitudinal direction of the bonding wire has a proportion of 30 to 100% in terms of areal percentage among crystal orientations in the longitudinal direction of the bonding wire, there can be improved a loop formability, that is, there can be improved a loop straightforwardness required in high-density mounting, and can be reduced variations in loop height. This is because when a surface crystal orientation is aligned, the bonding wire is resistant to lateral deformation, and the lateral deformation is reduced, whereby leaning failures can be reduced. Consequently, in an embodiment, in a measurement result when measuring crystal orientations on a surface of the bonding wire, a crystal orientation <111> angled at 15 degrees or less to a longitudinal direction of the bonding wire has a proportion of 30 to 100% in terms of areal percentage among crystal orientations in the longitudinal direction of the bonding wire. In view of reducing leaning failures, the above crystal orientation <111> has a proportion of more preferably 35% or more; further preferably 40% or more in terms of areal percentage.

(Method of Manufacture)

Next, the following describes a method for manufacturing the bonding wire according to the embodiment of the present invention. The bonding wire is obtained by manufacturing a Cu alloy for use in the core material, working it into a thin wire, forming the Pd coating layer and the Au layer, and performing heat treatment. After forming the Pd coating layer and the Au layer, another wire drawing and heat treatment may be performed. The following describes a method for manufacturing the Cu alloy core material, a method for forming the Pd coating layer and the alloy skin layer containing Au and Pd, and a method of heat treatment in detail.

The Cu core alloy for use in the core material is obtained by melting Cu as a raw material and additive elements together and solidifying them. An arc heating furnace, a high-frequency heating furnace, a resistance heating furnace, or the like can be used for the melting. In order to prevent gases such as $O_2$ and $H_2$ from mixing from the air, the melting is preferably performed in a vacuum atmosphere or an inert atmosphere such as Ar or $N_2$.

Examples of the method for forming the Pd coating layer and the Au layer on the surface of the Cu alloy core material include plating, evaporative deposition, and a melting process. Both electroplating and electroless plating can be used as plating. Electroplating called strike plating or flash plating is high in plating speed and is favorable in adhesiveness with a substrate. A solution for use in electroless plating is classified into a substitutional type and a reduction type; although the substitutional type plating alone is sufficient for a smaller thickness, performing the reduction type plating in stages after the substitutional type plating is effective for a larger thickness.

In evaporative deposition, physical adsorption such as sputtering, ion plating, or vacuum deposition and chemical adsorption such as plasma CVD can be used. They are all dry processes, and free from the necessity of cleaning after forming the Pd coating layer and the Au layer and from any concern about surface contamination and the like during cleaning.

When heat treatment is performed after forming the Pd coating layer and the Au layer, Pd in the Pd coating layer diffuses into the Au layer, and the alloy skin layer containing Au and Pd is formed. Instead of forming the alloy skin layer containing Au and Pd through the heat treatment after forming the Au layer, the alloy skin layer containing Au and Pd may be deposited from the beginning.

For the formation of the Pd coating layer and the alloy skin layer containing Au and Pd, both a method that forms them after performing wire drawing to a final wire diameter and a method that forms them on a large-diameter Cu alloy core material and performs wire drawing a plurality of times until a target wire diameter is obtained are effective. When the Pd coating layer and the alloy skin layer containing Au and Pd are formed at the final wire diameter in the former, the manufacture, quality control, and the like are simple. When the Pd coating layer, the alloy skin layer containing Au and Pd, and the wire drawing are combined in the latter, there is the advantage that adhesiveness with the Cu alloy core material improves. Specific examples of the respective methods of formation include a method that forms the Pd coating layer and the alloy skin layer containing Au and Pd on the Cu alloy core material with the final core diameter while successively sweeping the wire through an electroplating solution and a method that forms the Pd coating layer and the alloy skin layer containing Au and Pd by immersing a large-diameter Cu alloy core material into an electro or electroless plating solution and then drawing the wire to achieve the final wire diameter.

After forming the Pd coating layer and the alloy skin layer containing Au and Pd, heat treatment may be performed. Performing the heat treatment causes atoms to diffuse among the alloy skin layer containing Au and Pd, the Pd coating layer, and the Cu alloy core material, improves adhesive strength, and is effective in that the alloy skin layer containing Au and Pd and the Pd coating layer during working are prevented from peeling and productivity improves. In order to prevent $O_2$ mixing from the air, the heat treatment is preferably performed in a vacuum atmosphere or an inert atmosphere such as Ar or $N_2$.

In diffusion heat treatment and annealing heat treatment performed on the bonding wire, Cu as the core material may diffuse through the Pd coating layer and the alloy skin layer containing Au and Pd to reach the outermost surface of the bonding wire. In accordance with conditions (heat treatment temperature and time) of the diffusion heat treatment and the annealing heat treatment and the like, the degree of diffusion of Cu as the core material (the presence or absence of Cu on the outermost surface of the bonding wire and the Cu concentration on the outermost surface) can be adjusted.

As described above, in making Ga and Ge contained in the bonding wire, the effect of the invention can be exhibited by either of the method by which these elements are contained in the Cu core material and the method by which these elements are contained by depositing them onto the Cu core material or the wire surface. The same holds true for Ni, Ir, Pt, B, P, and Mg.

The simplest method of adding the above components is a method that adds component elements to starting materials of Cu. For example, high-purity copper and the above component elements are weighed and are then heated and melted in a high vacuum or in an inert atmosphere such as nitrogen and argon to produce a Cu alloy ingot to which the above components in a target concentration range have been added. Consequently, in a preferable embodiment, the Cu alloy core material of the bonding wire of the present invention contains one or more elements selected from Ga and Ge so that the concentration of the elements in total relative to the entire wire will be 0.011 to 1.5% by mass. The preferable numerical range of the total concentration is as described above. In another preferable embodiment, the Cu alloy core material of the bonding wire of the present invention contains one or more elements selected from Ni, Ir, and Pt so that the concentration of each of the elements relative to the entire wire will be 0.011 to 1.2% by mass. The preferable numerical range of the concentration is as described above. Consequently, in a preferable embodiment, the purity of Cu of the Cu alloy core material is 3N or less (preferably 2N or less). In a conventional Pd-coated Cu bonding wire, in view of bondability, a Cu core material with high purity (4N or more) is used, and there is a tendency to avoid the use of a Cu core material with low purity. The bonding wire of the present invention containing the specific elements has achieved the bonding reliability of the ball bonded part in the high-temperature, high-humidity environment required in on-vehicle devices especially preferably when the Cu alloy core material in which Cu is low in purity is used as described above. In another preferable embodiment, the Cu alloy core material of the bonding wire of the present invention contains one or more elements selected from B, P, and Mg so that the concentration of each of the elements relative to the entire wire will be 1 to 100 ppm by mass. The preferable numerical range of the concentration is as described above.

The components can also be contained by depositing the components on the wire surface during a wire manufacturing process. In this case, the deposition may be incorporated into any part of the wire manufacturing process and may be repeated a plurality of times. The deposition may be incorporated into a plurality of processes. The deposition may be added to the Cu surface before Pd coating, added to the Pd surface after Pd coating, added to the Au surface after Au coating, or incorporated into the coating processes. A method of deposition can be selected from (1) application of an aqueous solution, drying, and heat treatment, (2) plating (wet), and (3) evaporative deposition (dry).

When the method of application of an aqueous solution, drying, and heat treatment is employed, first, an aqueous solution of an appropriate concentration is prepared with a water-soluble compound containing the component elements. With this preparation, the components can be incorporated into the wire material. The preparation may be incorporated into any part of the wire manufacturing process and may be repeated a plurality of times. The preparation may be incorporated into a plurality of processes. The preparation may be added to the Cu surface before Pd coating, added to the Pd surface after Pd coating, added to the Au surface after Au coating, or incorporated into the coating processes.

When plating (wet) is used, plating can be either of electroplating or electroless plating. In electroplating, plating called flash plating, which is high in plating speed and favorable in adhesiveness with a substrate, can also be used in place of normal electroplating. A solution for use in electroless plating is classified into a substitutional type and a reduction type. The substitutional type plating is generally used for a smaller thickness, whereas the reduction type is used for a larger thickness. Either of them can be used and may be selected depending on the desired concentration to be added and a plating solution concentration and a time may be adjusted. Both electroplating and electroless plating may be incorporated into any part of the wire manufacturing process and may be repeated a plurality of times. Both electroplating and electroless plating may be incorporated into a plurality of processes. Both electroplating and electroless plating may be added to the Cu surface before Pd coating, added to the Pd surface after Pd coating, added to the Au surface after Au coating, or incorporated into the coating processes.

Examples of evaporative deposition (dry) include sputtering, ion plating, vacuum deposition, and plasma CVD. They have the advantages that being dry eliminates pretreatment and posttreatment and gives no concern about contamination. Although evaporative deposition generally has the problem that an addition speed of a target element is slow, it is one of the appropriate methods for the object of the present invention because the component elements are relatively low in addition concentration.

The pieces of evaporative deposition may be incorporated into any part of the wire manufacturing process or may be repeated a plurality of times. The pieces of evaporative deposition may be incorporated into a plurality of processes. The pieces of evaporative deposition may be added to the Cu surface before Pd coating, added to the Pd surface after Pd coating, added to the Au surface after Au coating, or incorporated into the coating processes.

The proportion of the crystal orientation <111> angled at 15 degrees or less to the longitudinal direction of the bonding wire among the crystal orientations in the longitudinal direction of the bonding wire, in a measurement result when measuring crystal orientations on a surface of the bonding wire, can be set to a range of 30 to 100% in terms of areal percentage according to the following method. Specifically, a working rate after forming the Pd coating layer or after forming the Pd coating layer and the Au skin layer is made large, whereby texture having directivity on the wire surface (texture of which crystal orientation is aligned in a wire drawing direction) can be developed. Specifically, the working rate after forming the Pd coating layer or after forming the Pd coating layer and the Au skin layer is made 90% or more, which allows the proportion of the crystal orientation <111> angled at 15 degrees or less to the longitudinal direction of the bonding wire among the crystal orientations in the longitudinal direction of the bonding wire to be 30% or more in terms of areal percentage, in a measurement result when measuring crystal orientations on the surface of the bonding wire. The working rate is represented by "working rate (%)=(wire sectional area before working−wire sectional area after working)/wire sectional area before working×100."

When the crystal orientations on the wire surface are measured, electron backscattered diffraction (EBSD) is preferably used. EBSD is characterized by observing crystal orientations on the observation surface and enabling an angle difference of the crystal orientations between adjacent measurement points to be illustrated and can observe the crystal orientations with high accuracy while being relatively simple even for a thin wire like the bonding wire.

The present invention is not limited to the embodiment, and appropriate alterations can be made within the scope of the essence of the present invention.

EXAMPLES

The following specifically describes the bonding wire according to an embodiment of the present invention with reference to examples.

(Sample)

First, the following describes a method for manufacturing a sample. Cu as a raw material of the core material with a purity of 99.99% by mass or more and containing inevitable impurities as the remainder was used. Ga, Ge, Ni, Ir, Pt, Pd, B, P, and Mg with a purity of 99% by mass or more and containing inevitable impurities as the remainder were used. Ga, Ge, Ni, Ir, Pt, Pd, B, P, and Mg as additive elements to the core material are mixed so that the wire or the core material will have a target composition. Regarding the addition of Ga, Ge, Ni, Ir, Pt, Pd, B, P, and Mg, although they can be mixed singly, or alternatively, they may be mixed so as to be a desired amount using a Cu master alloy containing the additive elements manufactured in advance if the element has a high melting point as a single body or if the element is added in an infinitesimal amount.

The Cu alloy as the core material was manufactured by charging the raw materials into a carbon crucible worked into a cylindrical shape with a diameter of 3 to 6 mm, heating and melting the raw materials at 1,090 to 1,300° C. in vacuum or in an inert atmosphere such as a $N_2$ or Ar gas using a high-frequency furnace, and performing furnace cooling. The obtained alloy with a diameter of 3 to 6 mm was drawn to be worked into a diameter of 0.9 to 1.2 mm, and a wire with a diameter of 300 to 600 μm was manufactured by successively performing wire drawing using a die. A commercially available lubricant was used for the wire drawing, and a wire drawing speed was 20 to 150 m/min. In order to remove an oxide film on the wire surface, pickling treatment with sulfuric acid was performed, and the Pd coating layer was formed by 1 to 15 μm so as to cover the entire surface of the Cu alloy as the core material. Furthermore, for partial wires, the alloy skin layer containing Au and Pd was formed by 0.05 to 1.5 μm on the Pd coating layer. For the formation of the Pd coating layer and the alloy skin layer containing Au and Pd, electroplating was used. A commercially available semiconductor plating solution was used for a plating solution. Heat treatment at 200 to 500° C. and wire drawing were then repeatedly performed to be worked into a diameter of 20 μm. After working, heat treatment was performed while causing a $N_2$ or Ar gas to flow so that breaking elongation will finally be about 5 to 15%. A method of heat treatment was performed while successively sweeping the wire and was performed while causing the $N_2$ or Ar gas to flow. A wire feeding speed was 20 to 200 m/min, a heat treatment temperature was 200 to 600° C., and a heat treatment time was 0.2 to 1.0 second.

By adjusting the working rate after forming the Pd coating layer or after forming the Pd coating layer and the alloy skin layer containing Au and Pd, there was adjusted the proportion (areal percentage) of the crystal orientation <111> angled at 15 degrees or less to the longitudinal direction among the crystal orientations in the longitudinal direction of the bonding wire, in a measurement result when measuring crystal orientations on the surface of the bonding wire.

For the concentration analysis of the Pd coating layer and the alloy skin layer containing Au and Pd, the analysis was performed using an Auger electron spectroscopic apparatus while sputtering the bonding wire from its surface in the depth direction with Ar ions. The thicknesses of the coating layer and the skin alloy layer were determined from an obtained concentration profile (the unit of the depth was in terms of $SiO_2$) in the depth direction. A region in which the Pd concentration was 50 at % or more and the Au concentration was less than 10 at % was determined to be the Pd coating layer, and a region in which the Au concentration on the surface of the Pd coating layer was in the range of 10 at % or more was determined to be the alloy skin layer. The thicknesses and compositions of the coating layer and the alloy skin layer are listed in Tables 1 and 2. The concentration of Pd in the Cu alloy core material was measured by a method that exposes a wire section and performs line analysis, point analysis, or the like on the exposed wire section by an electron probe micro analyzer installed in a scanning electron microscope. For the method for exposing the wire section, mechanical polishing, ion etching, or the like was used. For the concentrations of Ga, Ge, Ni, Ir, Pt, B, P, and Mg in the bonding wire, a solution in which the bonding wire was dissolved with a strong acid was analyzed using an ICP emission spectrometer or an ICP mass spectrometer, and they were detected as the concentrations of the elements contained in the entire bonding wire.

The configurations of the respective samples manufactured according to the above procedure are listed in the following tables. Table 1 lists working examples, and Table 2 list comparative examples. In Table 2, figures out of the range of the present invention are underlined.

TABLE 1

| | | Component content | | | | | | | | | Wire characteristics | | | Quality evaluation results | | | | | |
|---|---|---|---|---|---|---|---|---|---|---|---|---|---|---|---|---|---|---|---|
| | | In wire (% by mass) | | In wire (% by mass) (in core material (% by mass) for Pd) | | | | In wire (ppm by mass) | | | Film thickness of Pd coating layer | Film thickness of alloy skin layer containing Au and Pd | Areal percentage of surface crystal orientation | | | | FAB | Wedge | Crushed | |
| Test No | | Ga | Ge | Ga and Ge in total | Ni | Ir | Pt | Pd | B | P | Mg | (μm) | (μm) | <111> (%) | HAST | HTS | shape | bondability | shape | Leaning |
| Working Example | 1 | 0.020 | | 0.020 | | | | | | | | 0.15 | — | 68 | △ | △ | ○ | △ | ○ | ◎ |
| | 2 | 0.025 | | 0.025 | | | | | | | | 0.015 | 0.0005 | 94 | ○ | △ | ○ | ○ | ○ | ◎ |
| | 3 | 0.500 | | 0.500 | | | | | | | | 0.1 | 0.0005 | 89 | ◎ | △ | ◎ | ◎ | ◎ | ◎ |
| | 4 | 1.500 | | 1.500 | | | | | | | | 0.05 | 0.001 | 62 | ◎ | △ | ◎ | ◎ | ○ | ◎ |
| | 5 | | 0.011 | 0.011 | | | | | | | | 0.1 | 0.001 | 48 | △ | △ | △ | ◎ | ○ | ◎ |
| | 6 | | 0.025 | 0.025 | | | | | | | | 0.05 | 0.08 | 92 | ◎ | △ | ◎ | ◎ | ◎ | ◎ |
| | 7 | | 0.300 | 0.300 | | | | | | | | 0.05 | 0.01 | 59 | ◎ | △ | ◎ | ◎ | ◎ | ◎ |
| | 8 | | 1.500 | 1.500 | | | | | | | | 0.1 | 0.01 | 44 | ◎ | △ | ○ | ◎ | ○ | ◎ |
| | 9 | 0.015 | 0.011 | 0.026 | | | | | | | | 0.05 | 0.001 | 95 | ◎ | △ | ◎ | ◎ | ◎ | ◎ |
| | 10 | 0.010 | 0.015 | 0.025 | | | | | | | | 0.015 | 0.01 | 93 | △ | △ | ◎ | ◎ | ◎ | ◎ |
| | 11 | 0.020 | 0.005 | 0.025 | | | | | | | | 0.1 | 0.01 | 62 | △ | △ | ○ | ○ | ○ | ◎ |
| | 12 | 0.012 | 0.015 | 0.027 | | | | | | | | 0.15 | 0.003 | 55 | △ | △ | ○ | ◎ | ◎ | ◎ |
| | 13 | 0.050 | 0.070 | 0.120 | | | | | | | | 0.015 | 0.0005 | 79 | ◎ | △ | ○ | ◎ | ◎ | ◎ |
| | 14 | 0.016 | 0.050 | 0.066 | | | | | | | | 0.015 | 0.0005 | 53 | ◎ | △ | ◎ | ○ | ◎ | ◎ |
| | 15 | 0.050 | 0.600 | 0.650 | | | | | | | | 0.05 | 0.001 | 33 | ◎ | △ | ○ | ◎ | ◎ | ◎ |
| | 16 | 0.600 | 0.850 | 1.450 | | | | | | | | 0.05 | 0.003 | 67 | ◎ | △ | ◎ | ◎ | ◎ | ◎ |
| | 17 | 0.002 | 0.800 | 0.802 | | | | | | | | 0.05 | 0.003 | 33 | ◎ | ○ | ◎ | ◎ | ◎ | ◎ |
| | 18 | 0.030 | | 0.030 | 0.50 | | | | | | | 0.15 | 0.001 | 69 | ◎ | ◎ | ◎ | ◎ | ◎ | ◎ |
| | 19 | 0.030 | | 0.030 | 1.20 | | | | | | | 0.15 | 0.003 | 41 | ○ | ○ | ◎ | ◎ | ◎ | ◎ |
| | 20 | 0.030 | | 0.030 | | 0.50 | | | | | | 0.05 | — | 85 | ○ | ◎ | ◎ | △ | ○ | ◎ |
| | 21 | 0.030 | | 0.030 | | 1.20 | | | | | | 0.1 | 0.01 | 58 | ○ | ○ | ◎ | ◎ | ◎ | ◎ |
| | 22 | 0.030 | | 0.030 | | | 0.50 | | | | | 0.05 | 0.01 | 97 | ○ | ◎ | ◎ | ◎ | ◎ | ◎ |
| | 23 | 0.030 | | 0.030 | | | 1.20 | | | | | 0.1 | 0.01 | 73 | ○ | ○ | ◎ | ○ | ◎ | ◎ |
| | 24 | 0.030 | | 0.030 | | | | 0.50 | | | | 0.015 | 0.0005 | 65 | ○ | ◎ | ○ | ◎ | ◎ | ◎ |
| | 25 | 0.030 | | 0.030 | | | | 1.20 | | | | 0.1 | 0.01 | 72 | ○ | ○ | ○ | ◎ | ◎ | ◎ |
| | 26 | 0.030 | | 0.030 | | | | | 7 | | | 0.015 | 0.01 | 98 | ○ | ◎ | ◎ | ◎ | ◎ | ◎ |
| | 27 | 0.030 | | 0.030 | | | | | 100 | | | 0.015 | 0.001 | 94 | ○ | ○ | ◎ | ○ | ◎ | ◎ |
| | 28 | 0.030 | | 0.030 | | | | | | 7 | | 0.1 | 0.01 | 62 | ○ | ◎ | ◎ | ◎ | ◎ | ◎ |
| | 29 | 0.030 | | 0.030 | | | | | | 100 | | 0.015 | 0.08 | 68 | ○ | ◎ | ◎ | ◎ | ○ | ◎ |
| | 30 | 0.030 | | 0.030 | | | | | | | 7 | 0.05 | 0.01 | 49 | ○ | ○ | ◎ | △ | ◎ | ◎ |
| | 31 | 0.030 | | 0.030 | | | | | | | 100 | 0.05 | 0.05 | 40 | ○ | ◎ | ◎ | ◎ | ◎ | ◎ |
| | 32 | | 0.030 | 0.030 | 0.80 | | | | | | | 0.15 | 0.01 | 83 | ○ | ○ | ◎ | ◎ | ◎ | ◎ |
| | 33 | | 0.030 | 0.030 | 1.20 | | | | | | | 0.05 | 0.003 | 88 | ○ | ○ | ◎ | ◎ | ◎ | ◎ |
| | 34 | | 0.030 | 0.030 | | 0.80 | | | | | | 0.05 | 0.01 | 82 | ○ | ◎ | △ | ◎ | ◎ | ◎ |
| | 35 | | 0.030 | 0.030 | | 1.20 | | | | | | 0.15 | 0.001 | 94 | ○ | ○ | ◎ | ◎ | ◎ | ◎ |
| | 36 | | 0.030 | 0.030 | | | 0.80 | | | | | 0.15 | 0.08 | 92 | ○ | ○ | ◎ | ◎ | ◎ | ◎ |
| | 37 | | 0.030 | 0.030 | | | 1.20 | | | | | 0.15 | 0.001 | 87 | ○ | ◎ | △ | ◎ | ◎ | ◎ |
| | 38 | | 0.030 | 0.030 | | | | 0.80 | | | | 0.015 | 0.003 | 85 | ○ | ○ | ◎ | ◎ | ◎ | ◎ |
| | 39 | | 0.030 | 0.030 | | | | 1.20 | | | | 0.1 | 0.003 | 68 | ○ | ◎ | ○ | ◎ | ◎ | ◎ |
| | 40 | | 0.030 | 0.030 | | | | | 6 | | | 0.015 | 0.08 | 65 | ○ | △ | △ | ◎ | ◎ | ◎ |

TABLE 1-continued

| | Component content | | | | | | | | | | Wire characteristics | | | Quality evaluation results | | | | | |
|---|---|---|---|---|---|---|---|---|---|---|---|---|---|---|---|---|---|---|---|
| | In wire (% by mass) | | | In wire (% by mass) (in core material % by mass for Pd) | | | | | In wire (ppm by mass) | | | Film thickness of Pd coating layer (μm) | Film thickness of alloy skin layer containing Au and Pd (μm) | Areal percentage of surface crystal orientation <111> (%) | HAST | HTS | FAB shape | Wedge bondability | Crushed shape | Leaning |
| Test No | Ga | Ge | Ga and Ge in total | Ni | Ir | Pt | Pd | B | P | Mg | | | | | | | | | |
| 41 | | 0.030 | 0.030 | | | | | 100 | | | 0.15 | 0.0005 | 42 | ○ | △ | ◎ | ○ | ◎ | ◎ |
| 42 | | 0.030 | 0.030 | | | | | | 6 | | 0.1 | 0.001 | 88 | ○ | △ | ◎ | ○ | ◎ | ◎ |
| 43 | | 0.030 | 0.030 | | | | | | 100 | | 0.05 | 0.01 | 57 | ○ | △ | ◎ | ○ | ◎ | ◎ |
| 44 | | 0.030 | 0.030 | | | | | | | 6 | 0.15 | 0.0005 | 38 | ○ | △ | ◎ | ○ | ◎ | ◎ |
| 45 | | 0.030 | 0.030 | | | | | | | 100 | 0.05 | 0.01 | 76 | ○ | △ | ◎ | ○ | ◎ | ◎ |
| 46 | 0.500 | | 0.500 | 0.90 | | | | | | | 0.05 | 0.003 | 76 | ◎ | ○ | ◎ | ◎ | ◎ | ◎ |
| 47 | 0.500 | | 0.500 | | 0.90 | | | | | | 0.05 | — | 84 | ◎ | ○ | ◎ | ◎ | ◎ | ◎ |
| 48 | 0.500 | | 0.500 | | | 0.90 | | | | | 0.05 | 0.003 | 95 | ◎ | ○ | ◎ | △ | ◎ | ◎ |
| 49 | 0.500 | | 0.500 | | | | 0.90 | | | | 0.05 | 0.003 | 84 | ◎ | ○ | ◎ | ◎ | ◎ | ◎ |
| 50 | 0.500 | | 0.500 | 0.90 | | | | 30 | | | 0.05 | 0.003 | 94 | ◎ | ○ | ◎ | ◎ | ◎ | ◎ |
| 51 | 0.500 | | 0.500 | | 0.90 | | | 30 | 50 | | 0.1 | 0.01 | 60 | ◎ | ○ | ◎ | ◎ | ◎ | ◎ |
| 52 | 0.500 | | 0.500 | | | 0.90 | | 30 | 50 | | 0.1 | 0.003 | 45 | ◎ | ○ | ◎ | ◎ | ◎ | ◎ |
| 53 | 0.500 | | 0.500 | | | | 0.90 | | 50 | | 0.15 | 0.003 | 55 | ◎ | ○ | ◎ | ◎ | ◎ | ◎ |
| 54 | 0.500 | | 0.500 | 0.90 | | | | | | 10 | 0.15 | 0.001 | 88 | ◎ | ○ | ◎ | ◎ | ◎ | ◎ |
| 55 | 0.500 | | 0.500 | | 0.90 | | | | | 10 | 0.15 | 0.01 | 97 | ◎ | ○ | ◎ | ◎ | ◎ | ◎ |
| 56 | 0.500 | | 0.500 | | | 0.90 | | | | 10 | 0.15 | 0.001 | 41 | ◎ | ○ | ◎ | ◎ | ◎ | ◎ |
| 57 | 0.500 | | 0.500 | | | | 0.90 | | | 10 | 0.15 | 0.003 | 64 | ◎ | ○ | ◎ | ◎ | ◎ | ◎ |
| 58 | | 0.700 | 0.700 | 0.50 | | | | 15 | | | 0.1 | 0.01 | 58 | ◎ | ○ | ◎ | ◎ | ◎ | ◎ |
| 59 | | 0.700 | 0.700 | | 0.50 | | | 15 | | | 0.015 | 0.001 | 85 | ◎ | ○ | ○ | ◎ | ◎ | ◎ |
| 60 | | 0.700 | 0.700 | | | 0.50 | | 15 | | | 0.1 | 0.01 | 48 | ◎ | ○ | ◎ | ◎ | ◎ | ◎ |
| 61 | | 0.700 | 0.700 | | | | 0.50 | 15 | | | 0.1 | 0.01 | 64 | ◎ | ○ | ◎ | ◎ | ◎ | ◎ |
| 62 | | 0.700 | 0.700 | 0.50 | | | | | 70 | | 0.015 | 0.001 | 67 | ◎ | ○ | ○ | ◎ | ◎ | ◎ |
| 63 | | 0.700 | 0.700 | | 0.50 | | | | 70 | | 0.05 | 0.0005 | 87 | ◎ | ○ | ◎ | ◎ | ◎ | ◎ |
| 64 | | 0.700 | 0.700 | | | 0.50 | | | 70 | | 0.05 | 0.0005 | 88 | ◎ | ○ | ◎ | ◎ | ◎ | ◎ |
| 65 | | 0.700 | 0.700 | | | | 0.50 | | 70 | | 0.15 | 0.001 | 49 | ◎ | ○ | ◎ | ◎ | ◎ | ◎ |
| 66 | | 0.700 | 0.700 | 0.50 | | | | | | 40 | 0.05 | 0.003 | 72 | ◎ | ○ | ◎ | ◎ | ◎ | ◎ |
| 67 | | 0.700 | 0.700 | | 0.50 | | | | | 40 | 0.1 | 0.001 | 96 | ◎ | ○ | ◎ | ◎ | ◎ | ◎ |
| 68 | | 0.700 | 0.700 | | | 0.50 | | | | 40 | 0.1 | 0.003 | 58 | ◎ | ○ | ◎ | ◎ | ◎ | ◎ |
| 69 | 0.800 | 0.500 | 1.300 | | | | | 15 | | | 0.015 | 0.003 | 66 | ◎ | ○ | ◎ | ◎ | ◎ | ◎ |
| 70 | 0.080 | 1.200 | 1.280 | | | | | 15 | | | 0.15 | 0.003 | 67 | ◎ | ○ | ◎ | ○ | ◎ | ◎ |
| 71 | 0.500 | 0.040 | 0.540 | | | | | 15 | | | 0.15 | 0.01 | 69 | ◎ | ○ | ◎ | ◎ | ◎ | ◎ |
| 72 | 1.300 | 0.050 | 1.350 | | | | | | 100 | | 0.015 | 0.001 | 60 | ◎ | ○ | ◎ | ◎ | ◎ | ◎ |
| 73 | 0.300 | 0.500 | 0.800 | | | | | | 100 | | 0.015 | 0.01 | 87 | ◎ | ○ | ◎ | ◎ | ◎ | ◎ |
| 74 | 0.500 | 0.600 | 1.100 | | | | | | 100 | | 0.15 | 0.003 | 49 | ◎ | ○ | ◎ | ◎ | ◎ | ◎ |
| 75 | 0.080 | 0.040 | 0.120 | | | | | | | 30 | 0.015 | 0.001 | 82 | ◎ | ○ | ◎ | ◎ | ◎ | ◎ |
| 76 | 1.000 | 0.100 | 1.100 | | | | | | | 30 | 0.15 | 0.05 | 78 | ◎ | ○ | ◎ | ◎ | ◎ | ◎ |
| 77 | 0.030 | 0.600 | 0.630 | | | | | | | 30 | 0.05 | 0.001 | 39 | ◎ | ○ | ◎ | ◎ | ◎ | ◎ |
| 78 | 1.500 | 0.030 | 1.500 | 0.40 | | | | | 10 | | 0.15 | 0.08 | 83 | ○ | ◎ | △ | ◎ | ◎ | ◎ |
| 79 | 1.500 | | 1.500 | 0.40 | 0.30 | | | | 23 | | 0.15 | 0.01 | 88 | ◎ | ◎ | △ | ◎ | ◎ | ◎ |
| 80 | 1.500 | | 1.500 | 0.40 | | 0.30 | | | 30 | | 0.15 | 0.0005 | 97 | ◎ | ◎ | △ | ◎ | ◎ | ◎ |
| 81 | 1.500 | | 1.500 | 0.40 | | | 0.50 | | 24 | | 0.15 | 0.01 | 81 | ○ | ◎ | △ | ○ | ◎ | ◎ |
| 82 | 1.500 | | 1.500 | | 1.20 | | | 15 | 15 | | 0.1 | 0.003 | 72 | ◎ | ◎ | △ | ◎ | ◎ | ◎ |

TABLE 1-continued

| | Component content | | | | | | | | | | Wire characteristics | | | Quality evaluation results | | | | | |
|---|---|---|---|---|---|---|---|---|---|---|---|---|---|---|---|---|---|---|---|
| | In wire (% by mass) | | Ga and Ge in total | In wire (% by mass) (in core material % by mass) for Pd) | | | | In wire (ppm by mass) | | | Film thickness of Pd coating layer (μm) | Film thickness of alloy skin layer containing Au and Pd (μm) | Areal percentage of surface crystal orientation <111> (%) | | | | | | |
| Test No | Ga | Ge | | Ni | Ir | Pt | Pd | B | P | Mg | | | | HAST | HTS | FAB shape | bondability | Wedge | Crushed shape | Leaning |
| 83 | 1.500 | | 1.500 | | 1.20 | | | 15 | 30 | | 0.1 | 0.003 | 68 | ◎ | ◎ | △ | ◎ | ◎ | ◎ | ◎ |
| 84 | 1.500 | | 1.500 | | 1.20 | | | 15 | 30 | | 0.015 | 0.0005 | 78 | ◎ | ◎ | △ | ○ | ◎ | ◎ | ◎ |
| 85 | 1.500 | | 1.500 | 0.50 | 0.50 | | | | 10 | 50 | 0.15 | 0.05 | 79 | ◎ | ◎ | △ | ◎ | ◎ | ◎ | ◎ |
| 86 | 1.500 | | 1.500 | 0.50 | 0.50 | | | | 25 | 50 | 0.015 | 0.0005 | 65 | ◎ | ◎ | △ | ○ | ◎ | ◎ | ◎ |
| 87 | 1.500 | | 1.500 | 0.50 | 0.50 | | | | 30 | 50 | 0.15 | 0.01 | 39 | ◎ | ◎ | △ | ◎ | ◎ | ◎ | ◎ |
| 88 | | 1.200 | 1.200 | | 0.80 | 0.40 | | 15 | | | 0.15 | — | 95 | ◎ | ◎ | ◎ | ◎ | △ | ◎ | ◎ |
| 89 | | 1.200 | 1.200 | | 0.80 | 0.40 | | 24 | | | 0.05 | 0.001 | 87 | ◎ | ◎ | ◎ | ◎ | ◎ | ◎ | ◎ |
| 90 | | 1.200 | 1.200 | | 0.80 | 0.40 | | 60 | | | 0.1 | 0.01 | 66 | ◎ | ◎ | ◎ | ◎ | ◎ | ◎ | ◎ |
| 91 | | 1.200 | 1.200 | | 0.80 | | 0.40 | 35 | | | 0.15 | 0.01 | 64 | ◎ | ◎ | ◎ | ◎ | ◎ | ◎ | ◎ |
| 92 | | 1.200 | 1.200 | 0.80 | | | | | 60 | 8 | 0.15 | 0.001 | 74 | ◎ | ○ | ◎ | ◎ | ◎ | ◎ | ◎ |
| 93 | | 1.200 | 1.200 | 0.80 | | | | | 70 | 5 | 0.15 | 0.01 | 76 | ◎ | ○ | ◎ | ◎ | ◎ | ◎ | ◎ |
| 94 | | 1.200 | 1.200 | 0.80 | | | | | 80 | 10 | 0.15 | 0.003 | 47 | ◎ | ○ | ◎ | ◎ | ◎ | ◎ | ◎ |
| 95 | | 1.200 | 1.200 | 0.30 | | 0.60 | | 10 | 50 | | 0.05 | 0.0005 | 84 | ◎ | ○ | ◎ | ◎ | ◎ | ◎ | ◎ |
| 96 | | 1.200 | 1.200 | 0.30 | | 0.60 | | 15 | 60 | | 0.1 | 0.01 | 57 | ◎ | ○ | ◎ | ◎ | ◎ | ◎ | ◎ |
| 97 | | 1.200 | 1.200 | 0.30 | | 0.60 | | 20 | 70 | | 0.015 | 0.01 | 91 | ◎ | ◎ | ○ | ◎ | ◎ | ◎ | ◎ |
| 98 | 0.600 | 0.050 | 0.650 | | 0.60 | 0.70 | | | | 20 | 0.1 | 0.0005 | 41 | ◎ | ◎ | ◎ | ○ | ◎ | ◎ | ◎ |
| 99 | 1.100 | 0.300 | 1.400 | | 0.60 | 0.70 | | | | 60 | 0.15 | — | 87 | ◎ | ◎ | ○ | ◎ | △ | ◎ | ◎ |
| 100 | 0.800 | 0.400 | 1.200 | | 0.60 | 0.70 | | | | 100 | 0.05 | 0.001 | 75 | ◎ | ◎ | ◎ | ◎ | ◎ | ◎ | ◎ |
| 101 | 0.800 | 0.030 | 0.830 | | 0.60 | | 0.70 | | | 35 | 0.15 | 0.003 | 64 | ◎ | ◎ | ◎ | ◎ | ◎ | ◎ | ◎ |
| 102 | 0.050 | 1.100 | 1.150 | 1.20 | | | | | 75 | | 0.015 | 0.001 | 97 | ◎ | ◎ | ○ | ◎ | ◎ | ◎ | ◎ |
| 103 | 0.800 | 0.060 | 0.860 | 1.20 | | | | | 75 | | 0.015 | 0.05 | 86 | ◎ | ◎ | ○ | ◎ | ◎ | ◎ | ◎ |
| 104 | 0.030 | 0.800 | 0.830 | 1.20 | | | | | 75 | | 0.1 | 0.01 | 96 | ◎ | ◎ | ○ | ◎ | ◎ | ◎ | ◎ |
| 105 | 0.090 | 1.300 | 1.390 | | 0.30 | 0.40 | | 30 | 20 | | 0.1 | 0.01 | 66 | ◎ | ○ | ◎ | ◎ | ◎ | ◎ | ◎ |
| 106 | 0.700 | 0.700 | 1.400 | | 0.30 | 0.40 | | 40 | 20 | | 0.05 | — | 79 | ◎ | ◎ | ◎ | △ | ◎ | ◎ | ◎ |
| 107 | 0.200 | 0.600 | 0.800 | | 0.30 | 0.40 | | 50 | 20 | | 0.15 | 0.003 | 89 | ◎ | ◎ | ◎ | ◎ | ◎ | ◎ | ◎ |

TABLE 2

| | Test No | Component content | | | | | | | | | |
|---|---|---|---|---|---|---|---|---|---|---|---|
| | | In wire (% by mass) | | | In wire (% by mass) (in core material (% by mass) for Pd) | | | | In wire (ppm by mass) | | |
| | | Ga | Ge | Ga and Ge in total | Ni | Ir | Pt | Pd | B | P | Mg |
| Comparative Example | 1 | 0.010 | | 0.010 | | | | | | | |
| | 2 | 0.010 | | 0.010 | | | | | | | |
| | 3 | 0.010 | | 0.010 | | | | | | | |
| | 4 | | 0.010 | 0.010 | | | | | | | |
| | 6 | | 0.010 | 0.010 | | | | | | | |
| | 6 | | 0.010 | 0.010 | | | | | | | |
| | 7 | 0.0050 | 0.0050 | 0.010 | | | | | | | |
| | 8 | 0.0050 | 0.0050 | 0.010 | | | | | | | |
| | 9 | 0.0050 | 0.0050 | 0.010 | | | | | | | |

| | Test No | Wire characteristics | | | Quality evaluation results | | | | | |
|---|---|---|---|---|---|---|---|---|---|---|
| | | Film thickness of Pd coating layer (μm) | Film thickness of alloy skin layer containing Au and Pd (μm) | Areal percentage of surface crystal orientation <111> (%) | HAST | HTS | FAB shape | Wedge bondability | Crushed shape | Leaning |
| Comparative Example | 1 | 0.005 | 0.001 | 18 | X | △ | X | ⊚ | ○ | △ |
| | 2 | 0.2 | 0.003 | 68 | X | △ | X | ⊚ | ○ | ⊚ |
| | 3 | 0.3 | 0.01 | 28 | X | △ | X | ⊚ | ○ | △ |
| | 4 | 0.05 | 0.001 | 97 | X | △ | ⊚ | ⊚ | ○ | ⊚ |
| | 6 | 0.2 | 0.003 | 56 | X | △ | X | ⊚ | ○ | ⊚ |
| | 6 | 0.005 | 0.01 | 22 | X | △ | X | ⊚ | ○ | △ |
| | 7 | 0.3 | 0.001 | 56 | X | △ | X | ⊚ | ○ | ⊚ |
| | 8 | 0.05 | 0.003 | 22 | X | △ | ⊚ | ⊚ | ○ | △ |
| | 9 | 0.2 | 0.01 | 48 | X | △ | X | ⊚ | ○ | ⊚ |

(Method of Evaluation)

A crystal structure was evaluated with the wire surface as an observation surface. Electron backscattered diffraction (EBSD) was used as a method of evaluation. EBSD is characterized by observing crystal orientations on the observation surface and enabling an angle difference of the crystal orientations between adjacent measurement points to be illustrated and can observe the crystal orientations with high accuracy while being relatively simple even for a thin wire like the bonding wire.

Care should be taken when performing EBSD with a curved surface like the wire surface as a subject. When a region with a large curvature is measured, measurement with high accuracy is difficult. However, a bonding wire to be measured is fixed to a line on a plane, and a flat part near the center of the bonding wire is measured, whereby measurement with high accuracy can be performed. Specifically, the following measurement region will work well. The size in the circumferential direction is 50% or less of the wire diameter with the center in the wire longitudinal direction as an axis, whereas the size in the wire longitudinal direction is 100 μm or less. Preferably, the size in the circumferential direction is 40% or less of the wire diameter, whereas the size in the wire longitudinal direction is 40 μm or less, whereby measurement efficiency can be improved by reducing a measurement time. In order to further improve accuracy, it is desirable that three or more points be measured to obtain average information with variations taken into account. The measurement sites may be apart from each other by 1 mm or more so as not to be close to each other.

The proportion of the surface crystal orientation <111> was determined by calculating the areal percentage of the crystal orientation <111> angled at 15 degrees or less to the longitudinal direction among the crystal orientations in the longitudinal direction of the bonding wire with all crystal orientations identified by exclusive software (for example, OIM analysis manufactured by TSL Solutions) as a population.

The bonding reliability of the ball bonded part in a high-temperature and high humidity environment or a high-temperature environment was determined by manufacturing a sample for bonding reliability evaluation, performing HAST and HTS evaluation, and by the bonding longevity of the ball bonded part in each test. The sample for bonding reliability evaluation was manufactured by performing ball bonding onto an electrode formed by forming an alloy of Al-1.0% Si-0.5% Cu as a film with a thickness of 0.8 μm on a Si substrate on a general metallic frame using a commercially available wire bonder and sealing it with a commercially available epoxy resin. A ball was formed while causing a $N_2$+5% $H_2$ gas to flow at a flow rate of 0.4 to 0.6 L/min, and its size was in a range of a diameter of 33 to 34 μm.

Concerning the HAST evaluation, the manufactured sample for bonding reliability evaluation was exposed to a high-temperature and high-humidity environment with a temperature of 130° C. and a relative humidity of 85% using an unsaturated type pressure cooker tester and was biased with 7 V. A shear test on the ball bonded part was performed every 48 hours, and a time when a value of shear strength was half the shear strength initially obtained was determined to be the bonding longevity of the ball bonded part. The shear test after the high-temperature and high-humidity test was performed after removing the resin by acid treatment and exposing the ball bonded part.

A tester manufactured by DAGE was used for a shear tester for the HAST evaluation. An average value of measurement values of 10 ball bonded parts randomly selected was used for the value of the shear strength. In the evaluation, the bonding longevity being less than 96 hours was determined to be practically problematic to be marked with a symbol of "cross", being 96 hours or more to less than 144 hours was determined to be practicable but somewhat problematic to be marked with a symbol of "triangle", being 144 hours or more to less than 288 hours was determined to be practically no problem to be marked with a symbol of "circle", and being 288 hours or more was determined to be excellent to be marked with a symbol of "double circle" in the column "HAST" in Table 1.

Concerning the HTS evaluation, the manufactured sample for bonding reliability evaluation was exposed to a high-temperature environment with a temperature of 200° C. using a high-temperature thermostatic device. A shear test on the ball bonded part was performed every 500 hours, and a time when a value of shear strength was half the shear strength initially obtained was determined to be the bonding longevity of the ball bonded part. The shear test after the high-temperature and high-humidity test was performed after removing the resin by acid treatment and exposing the ball bonded part.

A tester manufactured by DAGE was used for a shear tester for the HTS evaluation. An average value of measurement values of 10 ball bonded parts randomly selected was used for the value of the shear strength. In the evaluation, the bonding longevity being 500 hours or more to less than 1,000 hours was determined to be practicable but be desired to be improved to be marked with a symbol of "triangle", being 1,000 hours or more to less than 3,000 hours was determined to be practically no problem to be marked with a symbol of "circle", and being 3,000 hours or more was determined to be especially excellent to be marked with a symbol of "double circle".

Concerning the evaluation of ball formability (FAB shape), a ball before performing bonding was collected and observed, and the presence or absence of voids on the ball surface and the presence or absence of deformation of the ball, which is primarily a perfect sphere. The occurrence of any of the above was determined to be faulty. The formation of the ball was performed while a $N_2$ gas was blown at a flow rate of 0.5 L/min in order to reduce oxidation in a melting process. The size of the ball was 34 μm. For one condition, 50 balls were observed. A SEM was used for the observation. In the evaluation of the ball formability, a case in which five or more failures occurred was determined to be problematic to be marked with a symbol of "cross", a case of three or four failures was determined to be practicable but somewhat problematic to be marked with a symbol of "triangle", a case of one or two failures was determined to be no problem to be marked with a symbol of "circle", and a case in which no failure occurred was determined to be excellent to be marked with Aa symbol of "double circle" in the column "FAB shape" in Table 1.

The evaluation of wedge bondability on the wire bonded part was determined by performing 1,000 pieces of bonding on leads of a lead frame and by the occurrence frequency of peeling of the bonded part. An Fe-42 at % Ni alloy lead frame plated with 1 to 3 μm Ag was used for the lead frame. In this evaluation, assuming bonding conditions more rigorous than normal, a stage temperature was set to 150° C., which was lower than a general set temperature range. In the evaluation, a case in which 11 or more failures occurred was determined to be problematic to be marked with a symbol of "cross", a case of 6 to 10 failures was determined to be practicable but somewhat problematic to be marked with a symbol of "triangle", a case of 1 to 5 failures was determined to be no problem to be marked with a symbol of "circle", and a case in which no failure occurred was determined to be excellent to be marked with a symbol of "double circle" in the column "wedge bondability" in Table 1.

The evaluation of a crushed shape of the ball bonded part was determined by observing the ball bonded part after bonding from immediately above and by its circularity. For a bonding counterpart, an electrode in which an Al-0.5% Cu alloy was formed as a film with a thickness of 1.0 μm on a Si substrate was used. The observation was performed using an optical microscope, and 200 sites were observed for one condition. Being elliptic with large deviation from a perfect circle and being anisotropic in deformation were determined to be faulty in the crushed shape of the ball bonded part. In the evaluation, a case in which six or more failures occurred was determined to be problematic to be marked with a symbol of "cross", a case of four or five failures was determined to be practicable but somewhat problematic to be marked with a symbol of "triangle", being one to three was determined to be no problem to be marked with a symbol of "circle", and a case in which a favorable perfect circle was obtained for all was determined to be especially excellent to be marked with a symbol of "double circle" in the column "crushed shape" in Table 1.

[Leaning]

To a lead frame for evaluation, 100 pieces of bonding were performed with a loop length of 5 mm and a loop height of 0.5 mm. As a method of evaluation, a wire upright part was observed from a chip horizontal direction, and evaluation was performed based on spacing when spacing between a perpendicular line passing through the center of the ball bonded part and the wire upright part was maximized (leaning spacing). If the leaning spacing was smaller than the wire diameter, leaning was determined to be favorable, whereas if the leaning spacing was larger, the upright part leaned, and the leaning was determined to be faulty. One hundred bonded wires were observed with an optical microscope, and the number of leaning failures was counted. A case in which seven or more failures occurred was determined to be problematic to be marked with a symbol of "cross", a case of four to six failures was determined to be practicable but somewhat problematic to be marked with a symbol of "triangle", a case of one to three failures was determined to be no problem to be marked with a symbol of "circle", and a case in which no failure occurred was determined to be excellent to be marked with a symbol of "double circle" in the column "leaning" in Table 1.

(Evaluation Results)

The bonding wires according to Working Examples 1 through 107 listed in Table 1 each include the Cu alloy core material and the Pd coating layer formed on the surface of the Cu alloy core material, the bonding wire containing one or more elements selected from Ga and Ge, and the concentration of the elements in total relative to the entire wire being 0.011 to 1.5% by mass. It has been revealed that with this configuration the bonding wires according to Working Examples 1 through 107 can obtain the reliability of the ball bonded part in the HAST test in the high-temperature, high-humidity environment with a temperature of 130° C. and a relative humidity of 850.

In contrast, in Comparative Examples 1 through 9 listed in Table 2, the reliability of the ball bonded part in the HAST test was not obtained since the concentration of Ga and Ge in total was out of the lower limit. In Comparative Examples 1 and 6, the FAB shape was a symbol of "cross" since the thickness of the Pd coating layer was out of the lower limit of the preferable range. In Comparative Examples 1, 3, 6, and 8, the leaning was a symbol of "triangle" since the areal percentage of the <111> crystal orientation was out of the preferable range of the present invention.

In the working examples of the present invention further including the alloy skin layer containing Au and Pd on the Pd coating layer, it has been revealed that excellent wedge bondability can be obtained caused by the fact that the layer thickness of the alloy skin layer containing Au and Pd is 0.0005 to 0.050 μm.

In the working examples in which the bonding wires further contain at least one element selected from Ni, Ir, Pt, and Pd, it has been revealed that the high-temperature reliability of the ball bonded part by the HTS evaluation is favorable caused by the fact that the concentration of each of the elements other than Pd relative to the entire wire is 0.011 to 1.2% by mass, and the concentration of Pd contained in the Cu alloy core material is 0.05 to 1.2% by mass.

In the working examples in which the bonding wires further contain at least one element selected from B, P, and Mg, the crushed shaped of the ball bonded part was favorable caused by the fact that the concentration of each of the elements relative to the entire wire was 1 to 100 ppm by mass.

The invention claimed is:

1. A bonding wire for a semiconductor device, comprising:
   a Cu alloy core material; and
   a Pd coating layer formed on a surface of the Cu alloy core material, wherein
   the bonding wire contains Ga, and
a concentration of Ga relative to the entire wire is 0.025% by mass or more and 1.5% by mass or less.

2. The bonding wire for a semiconductor device according to claim 1, wherein a thickness of the Pd coating layer is 0.015 μm or more and 0.150 μm or less.

3. The bonding wire for a semiconductor device according to claim 1, further comprising an alloy skin layer containing Au and Pd on the Pd coating layer.

4. The bonding wire for a semiconductor device according to claim 3, wherein a thickness of the alloy skin layer containing Au and Pd is 0.0005 μm or more and 0.050 μm or less.

5. The bonding wire for a semiconductor device according to claim 1, wherein
   the bonding wire further contains one or more elements selected from Ni, Ir, and Pt, and
   a concentration of each of the elements relative to the entire wire is 0.011% by mass or more and 1.2% by mass or less.

6. The bonding wire for a semiconductor device according to claim 1, wherein
   the Cu alloy core material contains Pd, and
   a concentration of Pd contained in the Cu alloy core material is 0.05% by mass or more and 1.2% by mass or less.

7. The bonding wire for a semiconductor device according to claim 1, wherein
   the bonding wire further contains at least one element selected from B, P, and Mg, and
   a concentration of each of the elements relative to the entire wire is 1 ppm by mass or more and 100 ppm by mass or less.

8. The bonding wire for a semiconductor device according to claim 1, in a measurement result when measuring crystal orientations on a surface of the bonding wire, a crystal orientation <111> angled at 15 degrees or less to a longitudinal direction has a proportion of 30% or more and 100% or less among crystal orientations in the longitudinal direction of the bonding wire.

9. The bonding wire for a semiconductor device according to claim 1, wherein Cu is present in an outermost surface of the bonding wire.

* * * * *